(12) United States Patent
Raichle et al.

(10) Patent No.: US 6,784,637 B2
(45) Date of Patent: Aug. 31, 2004

(54) BATTERY CHARGER/TESTER WITH STORAGE MEDIA

(75) Inventors: Kurt Raichle, Owatonna, MN (US); Jeff Patterson, Gobles, MI (US); Paul Sontheimer, Owatonna, MI (US)

(73) Assignee: SPX Corporation, Charlotte, NC (US)

( * ) Notice: Subject to any disclaimer, the term of this patent is extended or adjusted under 35 U.S.C. 154(b) by 0 days.

(21) Appl. No.: 10/235,704

(22) Filed: Sep. 6, 2002

(65) Prior Publication Data

US 2004/0000891 A1 Jan. 1, 2004

Related U.S. Application Data

(60) Provisional application No. 60/391,620, filed on Jun. 27, 2002.

(51) Int. Cl.[7] .......................... H02J 7/00; G01N 27/416
(52) U.S. Cl. ........................................ 320/107; 324/426
(58) Field of Search ................................. 320/107, 134, 320/136, 110; 324/426

(56) References Cited

U.S. PATENT DOCUMENTS

| | | | | |
|---|---|---|---|---|
| 4,423,378 A | | 12/1983 | Marino et al. | 324/427 |
| 5,049,804 A | * | 9/1991 | Hutchings | 320/110 |
| 5,583,416 A | | 12/1996 | Klang | 320/22 |
| 5,589,757 A | | 12/1996 | Klang | 320/22 |
| 5,831,435 A | * | 11/1998 | Troy | 324/426 |
| 6,037,778 A | | 3/2000 | Makhija | 324/433 |

* cited by examiner

Primary Examiner—Gregory J. Toatley, Jr.
(74) Attorney, Agent, or Firm—Baker & Hostetler LLP

(57) ABSTRACT

A method and apparatus that allows a battery charger/tester to store and retrieve information from a storage media. Information, such as the result of the charge and testing of the battery, can be stored on the storage media. Additionally, information, such as firmware updates, can be uploaded from the storage media.

17 Claims, 6 Drawing Sheets

BATTERY CHARGER/TESTER WITH STORAGE MEDIA

Under the provisions of Section 119(e) of 35 U.S.C., Applicants hereby claim the benefit of the filing date of Prior Provisional Application No. 60/391,620, filed Jun. 27, 2002, for the above identified United States Patent Application.

FIELD OF THE INVENTION

Embodiments of the present invention generally relate to a power source charger and tester. More particularly, the present invention relates to an apparatus and method that allows data to be stored and retrieved on a battery charger/tester.

BACKGROUND OF THE INVENTION

Rechargeable batteries are an important source of clean portable power in a wide variety of electrical applications, including automobiles, boats and electric vehicles. Lead-acid batteries are one form of rechargeable battery that are commonly used to start engines, propel electric vehicles, and to act as a source of back-up power when an external supply of electricity is interrupted. While not particularly energy efficient, due to the weight of lead in comparison to other metals, the technology of lead-acid batteries is mature. As a result, the batteries are cheap, reliable, and readily produced and thus, continue to constitute a substantial portion of the rechargeable batteries being produced today.

The ability of lead-acid batteries to deliver large amounts of electrical power is well known, particularly when associated with the starting and powering of motor vehicles. Because the lead-acid batteries can be depleted of power overtime, such as when they are not in use over a period of time, or when a light in a car is left on for an extended period of time, they need to be recharged and tested. A number of battery testers and chargers have thus been developed to charge and test the lead-acid battery.

Most conventional battery charger/tester are equipped to provide multiple charging rates for charging different size batteries. The multiple charging rates are achieved by varying the charging voltage at the battery terminals, generally by changing the transformer primary/secondary winding ratio. An operator manually selects the rate at which the battery should be charged and also the duration of the charge cycle if the charger is equipped with a timer function.

Many defects found in lead-acid batteries and other types of batteries are the result of poor recharging control in conventional chargers. For example, an operator may undercharge or overcharge the battery at a very high rate resulting in the deterioration of the battery. Overcharging a battery wastes energy, reduces the life of the battery, and may permanently damage the battery. Additionally, conventional battery chargers can also include testers with the appropriate gauges in order to determine the current state of charge in a battery, how long and at what rate a particular battery should be charged, whether it is safe to charge the battery, and whether the battery is capable of accepting a charge.

Once the battery charger/tester is in operation, the operator must return to check the status of the battery to ensure that the battery is charging properly. Because conventional battery requires actual visual inspection of the gauges, the operator can waste valuable time and money to inspect all the batteries that are currently being charged instead of generating money by working on other projects.

During the charging period of the battery, temperature of the battery is an indicator as to how successfully the battery is accepting the charge. Different batteries accept the charge in a number of different ways. For example, some batteries heat up beyond a normal range. Anything beyond this normal range is an indication that the battery is not accepting the charge in an efficient manner.

There is a need for a battery charger/tester to include a temperature sensing device, which monitors the device throughout the entire processing charging and testing process. There is a further need to provide the collected temperature data back to the charger to enable it to adjust the charge/test rate of the battery based upon this data.

After the battery is tested and charged, the results are typically printed out and kept in file folders for warranty purposes. Because they are stored in file cabinets, it takes time to find the correct file (assuming that they were correctly filed) and match it up to the battery. Additionally, paper files often gets misplaced because they can be stored in so many different places or often are thrown away because of limited on-site storage. There is a need for an apparatus and method to easily match previously tested and charged batteries with their previous results. There is a further need for an apparatus and method to store information in less space.

SUMMARY OF THE INVENTION

Embodiments of the present invention generally provide for a battery charger/tester having a storage media. The battery charger/tester can store information and retrieve information from the storage media.

In one embodiment of the invention, a charging apparatus that can include a power source charger having a module port, and a removable data module received in the module port and is in communication with the power source charger. The power source charger can include a tester. The power source charger can also include a controller that is in communication with the removable data module. The controller can store data and retrieve data on the removable data module. The removable data module can be selected from a group that can include a floppy disc, a tape drive cartridge, an optical media, a flash memory, a magnetic based media, a magneto optical, a hard drive, any other removable media and a combination thereof. The removable data module's data can be selected from a group that can include the result of the charging/testing of the battery, the battery's warranty information, the battery type, the battery brand, the battery model, previous information regarding charging/testing of the battery, firmware update, diagnostic or operating parameters information of the charger, maintenance information of the charger, any other data required by the operator, and a combination thereof.

In one embodiment a method of storing and retrieving data for a charging apparatus is provided and can include operating the charging apparatus, and accessing a removable data module by a microprocessor. The charging apparatus can further include a tester. Operating the charging apparatus can be charging and testing the battery. Accessing the removable data module can be storing data resulting from operating the battery charger and can be retrieving previously stored data. The removable data module can be selected from a group that can include a floppy disc, a tape drive cartridge, an optical media, a flash memory, a magnetic based media, a magneto optical, a hard drive, any other removable media, and a combination thereof.

In another embodiment, a charging system that can include a power source charger means having a module receiving means, and a removable data means that can be received in the module receiving means and is in communication with the power source charger means. The power source charger means can further include a power source testing means. Additionally, the power source charger means can include a controller means that is in communication with the removable data means. The controller means can control and store data onto the removable data means. The controller means can also control and retrieve data from the removable data means. The removable data means can be selected from that can include a floppy disc, a tape drive cartridge, an optical media, a flash memory, a magnetic based media, a magneto optical, a hard drive, any other removable media, and a combination thereof.

There has thus been outlined, rather broadly, the more important features of the invention in order that the detailed description thereof that follows may be better understood, and in order that the present contribution to the art may be better appreciated. There are, of course, additional features of the invention that will be described below and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

DETAILED DESCRIPTION OF THE PREFERRED EMBODIMENT

Figure 1:
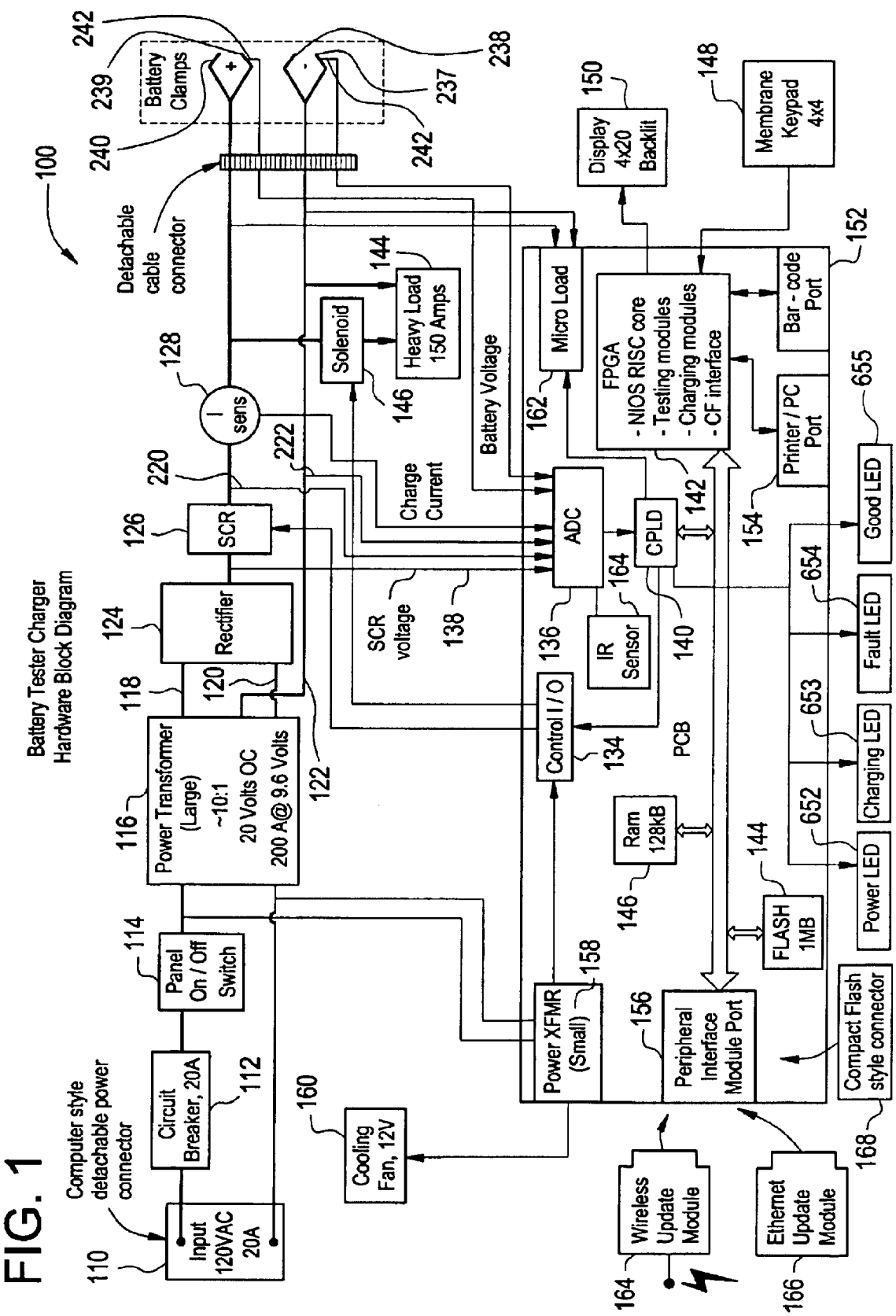
FIG. 1 is a hardware block diagram of an embodiment of the current invention.

FIG. 1 is an embodiment of the current invention. The battery charger/tester 100 ("charger 100") can include a power source 110 that provides a 120V (volts) AC (alternating current) to the charger 100. A circuit breaker 112 is provided to prevent damage that can be caused by a sudden power surge or a short in the system. A power switch 114 is linked to the power source 110 to enable the operator to turn the charger 100 on or off.

A power transformer 116 is provided to step down both the voltage and current to a level that enables the charger 100 to charge and/or test a battery. In a preferred embodiment, the power source 110 supplies the charger 100 with 120V AC. The power transformer 116 reduces the 120V AC to approximately 20–25V AC, which is optimal for charging the battery. Two lines 118, 120 from the power transformer 116 are inputted into a rectifier 124 and a third line 122 is directly coupled to the negative clamp 238. The lines 118, 120 pulse alternately through a full-wave rectifier 124 at a cycle of 60 Hz. The diodes of the rectifier 124 convert the positive AC voltage to DC (direct current) power supply. The third line 122 provides a return path for the negative voltage of outputs 118, 120 to return to the transformer 116.

A silicon control rectifier (SCR) 126 or thyristor is included in the preferred embodiment to regulate the output from the rectifier 124 to the battery. Exiting from the rectifier 124 is a pulsed positive sine waveform with peak voltages and current. The sine waveform results in varying voltages and current being outputted from the rectifier 124. The SCR 126 essentially operates as a switch allowing certain voltages and/or current to pass to the battery.

The operator can choose either a voltage or a current or both to charge the battery. This selection is called a set-point. This set-point is then transmitted to a FPGA 142 (field programmable gate array, discussed below), which then determines at which point in the sine wave to allow voltage to pass through to the battery. This point in the sine wave is related to the set-point as chosen by the operator. The set-point, depending on the selection of the operator, is situated on the sine wave by starting from the end of the sine wave and working in a rearward direction. Once the set-point is located on the sine wave, the voltage underneath the sine wave is allowed to pass through. Therefore, the set-point voltage is a mean value of a range of voltages.

For example, if the operator decides to charge the battery at 12V, this set-point of 12V is entered into the charger 100. The set-point is transmitted to the FPGA 142, which then determines at which point in the sine wave to allow the voltage or current to pass through to the battery. The 12V set-point in this example permits voltages larger than and less than 12V to pass through to the battery. The mean of the voltages distributed to the battery will approximately equal twelve volts.

The SCR 126 operates essentially as a switch and allows current or voltage to pass to the battery at a set-point fixed by the operator. The SCR 126 can operate based on either voltage, current or a combination thereof. The SCR 126 is normally switched off until it receives a signal from an I/O control (input/output) 134. The voltage or current exiting from the rectifier 124 is transmitted to an ADC (analog-to-digital converter) 136. The ADC 136 in turn transmits the voltage or current information to a linked CPLD (computer programmable logic device) 140, which is linked to the FPGA 142. The FPGA 142, simulating as a processor, determines the operability of the SCR 126 by comparing the previously programmed set-point value with the output value of the rectifier 124. If the output value of the rectifier 124 is equal or greater than the set-point of the SCR 126, then the FPGA 142 instructs the I/O control 134 to send a signal to the SCR 126 to allow the output voltage or current to pass to the battery. For example, if the operator desires a minimum current of 20 amps, the SCR 126 will allow a current equal to or exceeding 20 amps to pass to the battery.

A current sensor 128 is provided at the output of the SCR 126 to monitor or sense the current exiting from the rectifier 124 and the SCR 126. The current from the rectifier 124 is relayed to the ADC 136, which like the voltage is fed to the CPLD 140 and then onto the FPGA 142. The FPGA 142 verifies if the current from the rectifier 124 is equal to or exceeds the current set-point value. The output from the current sensor 128 is connected to the battery clamps 238, 240.

Figure 2:
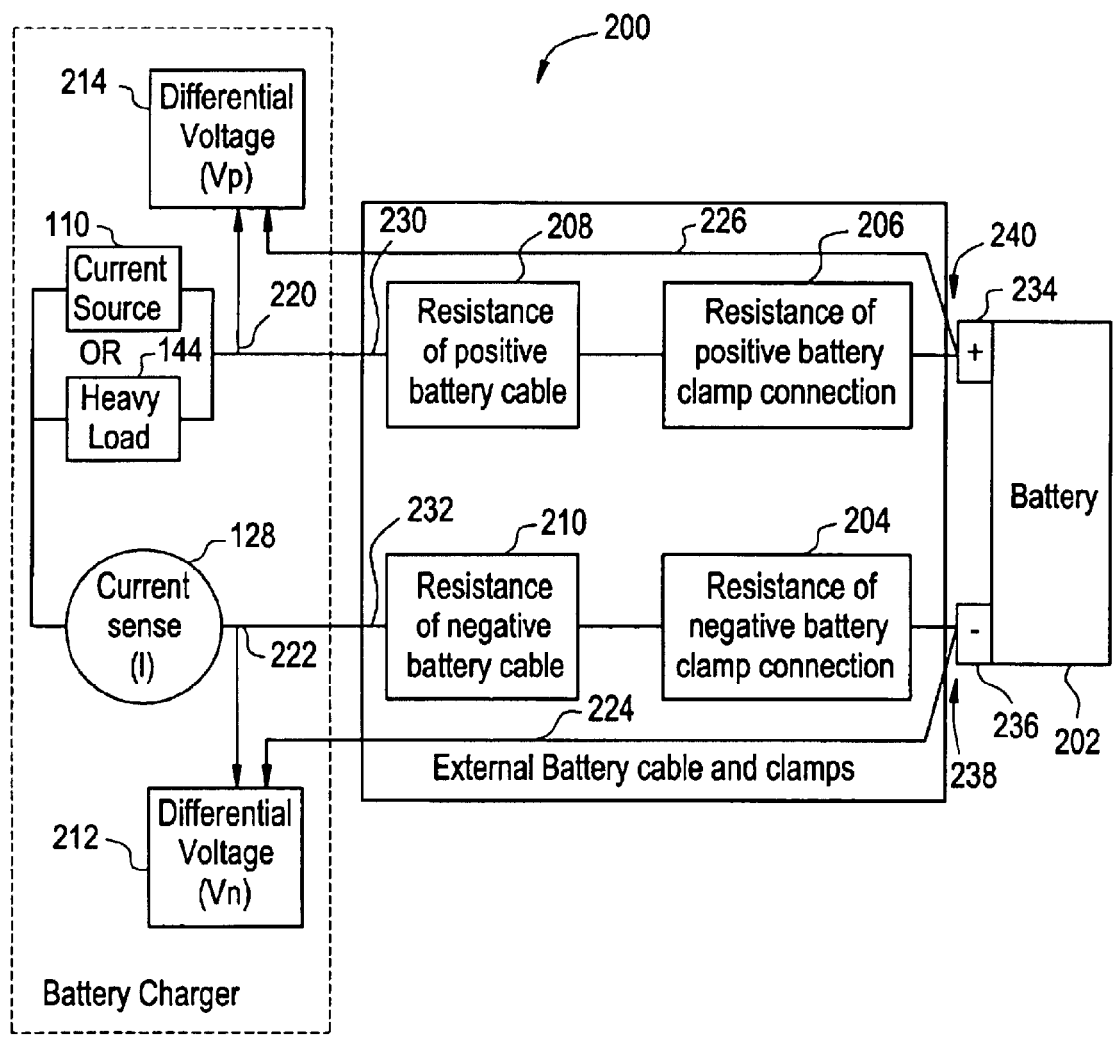
FIG. 2 is a hardware block diagram.

FIG. 2 illustrates a battery tester charger 200 according to one embodiment of the invention. A battery 202 having a positive terminal 234 and a negative terminal 236 may be attached to the battery tester charger 200 via a positive clamp 240 and a negative clamp 238 located at an end of the respective positive and negative cables 230, 232.

In a preferred embodiment, the battery tester charger 200 can determine whether the connections between the battery 202 and the clamps 238, 240 are acceptable. A connection test may be performed at either the positive 240 or the negative clamp 238 connection by applying the connection test to the positive components 230, 240 or negative components 232, 238 of the battery tester charger 200. Of course, applying the connection test to both components will test both the positive and negative connections. The connection test may be performed by comparing the voltage in the battery cables 230, 232 upstream from the connection of the clamps 238, 240, and the voltage at the connection of the clamps 238, 240. Voltage loss due to cable resistances 208, 210 may be considered and subtracted from the difference in voltage at the clamps 238, 240 and the upstream position. Additional differences in voltage between the upstream position and the connections of the clamps 238, 240 may be caused by clamp connection resistances 206, 204.

The testing of the battery connections can be applied to either the positive or negative components to test the connections individually or can be applied to both components to test both connections. The external battery cables 230, 232 are attached to the respective terminals 234, 236 of the battery 202 via the respective clamps 240, 238. Standard clamps, such as alligator clamps, may be used.

A portion 237, 239 (FIG. 1) of each clamp 238, 240 is isolated from the remainder of the clamps 238, 240 and the associated cables 232, 230. Portions 237, 239 can be isolated from the remainder of the clamps 238, 240 by a non-conductive element. The cables 232, 230 can carry a large current, either to the battery 202 when charging or from the battery when the battery is in use. The isolated portions 237, 239 may be connected to another device to determine the voltage at terminals 234, 236. For example, the isolated portions 237, 239 may be attached to high impedance wires 226, 224 to differential operational amplifiers 214, 212 (opp. amp) as shown in FIG. 2. Alternately, in some optional embodiments, as shown in FIG. 1, the high impedance wires 226, 224 may be attached to the ADC 136.

The battery connections may be tested to determine the resistances 206, 204 associated with the connection when the battery 202 is charged by a current source 110 or exposed to a heavy load 144. Whether the battery 202 is charging or in use, large current will flow through the cables 230, 232 and clamps 240, 238. A sensor 220, 222 in the battery charger tester 200 senses the voltage upstream from the clamps 240, 238 and the battery terminals 234, 236 connections and inputs a signal representative of the voltage to opp amps 214, 212 or optionally to the ADC 136. For example, in some optional embodiments of the invention, the voltage may be sensed upstream from the current sense 128 in both cables 230, 232 as shown in FIG. 1. As mentioned above, voltage is sensed in the isolated portions 237, 239 and compared to the voltage sensed upstream. The cable resistances 208, 210 are known, and the portion of the voltage difference between the voltage in the isolated portions 237, 239 and the voltage at the upstream position is accounted for by the cable resistances 208, 210. The remaining voltage difference between the voltage measured at the isolated portions 237, 239 and the upstream positions is due to the resistances in the clamps 240, 238 and terminal 234, 236 connections. In optional embodiments of the invention, cable resistances 208, 210 and the associated difference in voltage due to cable resistances 208, 210, may be neglected or approximated.

The resistance of the connections 206, 204 can be analyzed using Ohm's law, V=IR, where V stands for voltage, I stands for current, and R stands for resistance. Simple algebraic manipulation yields R=V/I. The unknown connection resistances 206, 204 associated with the connection can be expressed in terms of known parameters of current and voltage, thus the resistances 206, 204 can be determined.

Once the connection resistances 206, 204 are determined, each connection can be evaluated to determine whether the connection is acceptable or not. In one embodiment, a method is provided and compares the connection resistances 206, 204 against a predetermined acceptable and non-acceptable range of connection resistance. Based on the comparison, the operator can determine whether the connection is acceptable or not.

In an alternative embodiment, a method is provided to compare the voltage differences between the isolated portions 237, 239 and the voltage in the cables 230, 232 at the upstream positions. If the difference in voltage between the two locations is negligible, then the connection is likely to be acceptable. Optionally, the difference in voltage due to cable resistances 208, 210 may be subtracted from the voltage difference or otherwise accounted for in determining whether the connections are acceptable or not. If the voltage difference is higher than a predetermined maximum amount, then the connection between the battery terminal 234 and the clamp 140 will likely be unacceptable.

If the connection is not acceptable, the battery tester charger 200 can alert or notify the operator. In some embodiments, the battery tester charger 200 may alert the operator as to which connection (positive or negative) is unacceptable or whether both are unacceptable. In some embodiments, the battery tester charger 200 may alert the operator that the connection(s) are acceptable. The operator may be alerted by a variety of ways, such as an indicator light, a message on a display screen, an audible signal, or other ways that are disclosed herein. Because the operator is warned that a connection is not acceptable, the operator may take corrective measures to improve the connection, such as cleaning or replacing the terminals 234, 236 or clamps 240, 238.

Referring to FIG. 1, in the preferred embodiment of the invention, a Sabre Battery Test procedure is used as a heavy load test to analyze the condition of the battery. The heavy load test is applied with a heavy load 144 that includes a solenoid switch 146. The solenoid switch 146 is operated by the FPGA 142 through the I/O control 134 via the CPLD 140. The solenoid switch 146 in the heavy load test ensures that a high load amperage test can be efficiently and safely transmitted to the battery. One detraction in incorporating the solenoid switch 146 with the heavy load test is that it is not possible to make an exact determination of when the heavy load 144 is started or ended. This results from the mechanics of the solenoid switch 146 in that when the switch is turned off or on, it does not occur immediately. Therefore, there is a delay that fluctuates due to the mechanics of the solenoid switch 146 which makes exact testing and charging more difficult. One of ordinary skill in the art will recognize that the solenoid 146 can be replaced with electronic switching devices, such as transistors in an alternate embodiment. However, cost considerations drive the design of the preferred embodiment and a mechanical solenoid switch 146 was selected.

The preferred embodiment analyzes the charge-state of a given type of battery, determines whether the battery is defective and, if not, charges the battery at its most optimum charge rate up to its maximum allowed charging volts. Furthermore, the preferred embodiment executes its analysis, determination, and charging in the safest and most optimal time possible.

Figure 3:
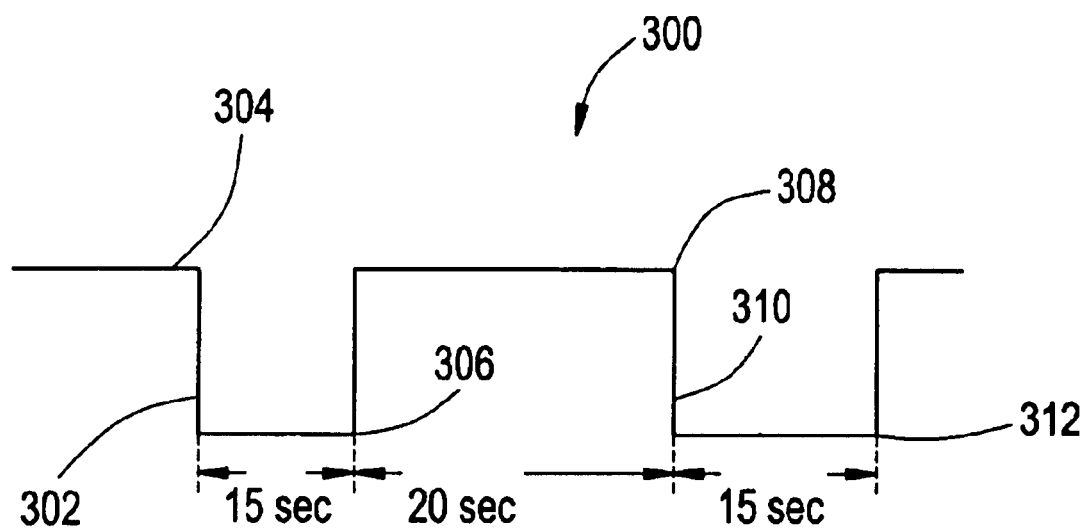
FIG. 3 is a diagram of the process for applying a load to an open circuit in accordance with a preferred embodiment of the present invention.

In operation, the heavy load test is shown in the Sabre Test Timing Diagram 300 in FIG. 3. The Sabre Battery Test requires a first applied load 302 to be placed on an open circuit 304. A battery voltage reading ("LVA15") 306 can be taken at the end of the first applied load 302, which is approximately fifteen seconds after the first load 302 is applied and released. A bounce back voltage measurement ("Rv") 308 is taken approximately twenty seconds after the first applied load 302 is turned off. A second applied load 310 is then placed on the open circuit 304 and maintained for approximately fifteen seconds. Another battery voltage reading ("LVB15") 312 is taken at the end of the second applied load 310.

Heavy load tests are highly accurate for testing charged batteries. If the battery to be tested is partially charged, then the test accurately determines whether the battery is defective. A person skilled in the art will recognize that any heavy load test procedure that is suitable for testing the condition of the battery may be used. Additionally, load as used herein can also be a charge.

If the condition of the battery is such that the battery can be recharged, a preferred embodiment of the invention can calculate a set time to charge the battery. If LVB15 312 is less than 4.0 V, the set time, i.e., maximum charge time, equals approximately forty-five minutes. If LVB15 312 is equal to or greater than 4.0 V, the set charge time is calculated as follows:

Set time=(12.5−$V_{ss}$)*56.25 minutes

Where, $V_{ss}$=bounce back voltage ("Rv") if 11.7V<=Rv<=12.5V $V_{ss}$=12.5V if Rv>12.5 V $V_{ss}$=11.7V if Rv<11.7 V By applying the heavy load test and monitoring the bounce back voltage, the charger 100 calculates the state of charge of the battery and the set time required to charge the battery while maintaining an optimum charge rate. The charger 100 controls the optimum charge rate by precisely controlling the charging voltage throughout the charging cycle.

If the battery condition can be charged, as determined by the heavy load test (e.g., Sabre Battery Test), further testing and charging will be performed. If the battery condition is determined to be faulty, then testing is terminated and the battery can be discarded. Therefore, the operator does not waste time and effort to charge the defective battery.

Figure 4:
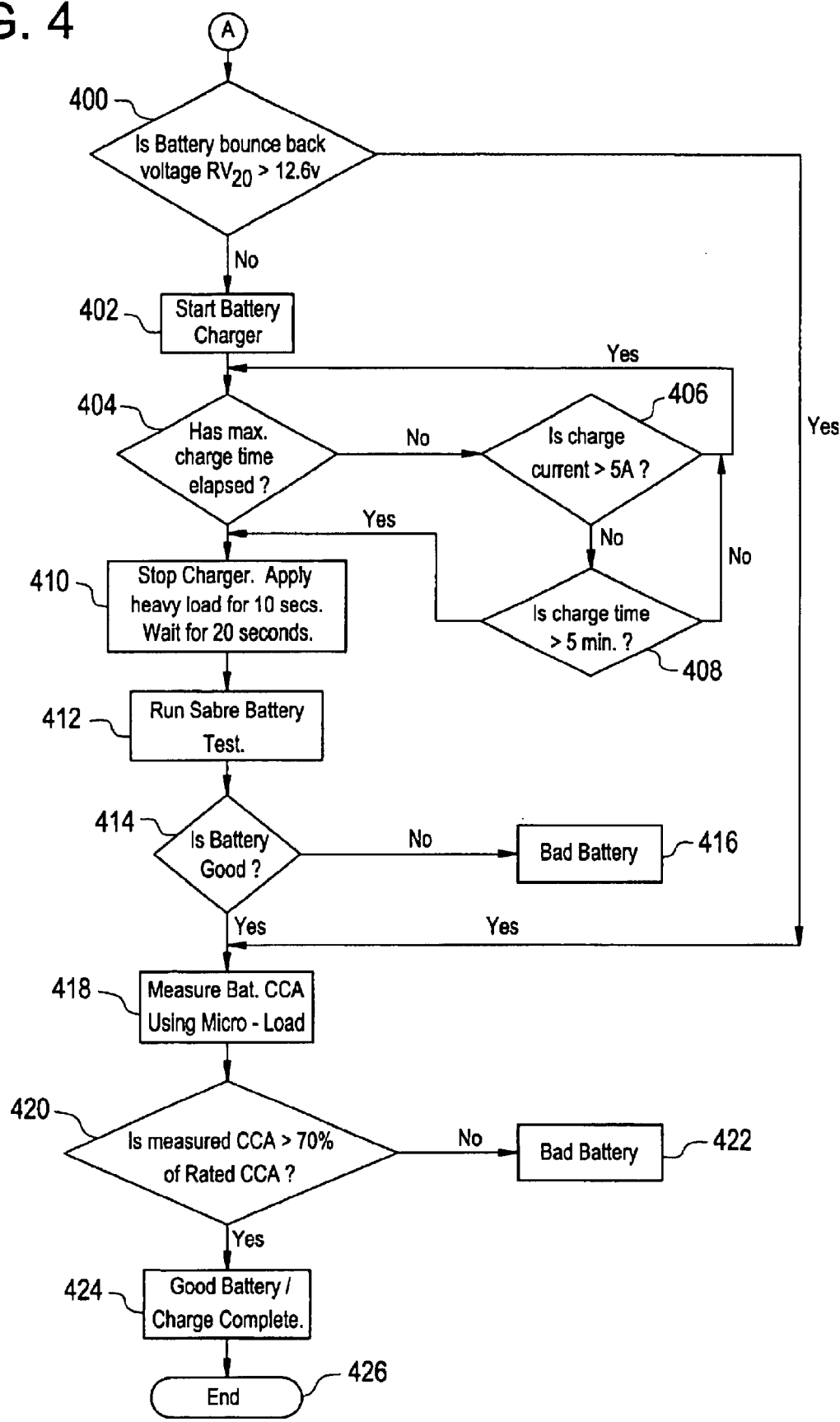
FIG. 4 is a flowchart of the process for testing and charging partially charged batteries in accordance with a preferred embodiment of the present invention.

If the battery condition is determined to be functional, additional testing and charging are performed, as depicted in FIG. 4. The first step in this testing is to determine whether the bounce back voltage is greater than 12.6 volts 400. The bounce back voltage is a measure of the state of battery charge. If the bounce back voltage is determined to be greater than 12.6 volts, the battery tester/charger will perform a micro-load test 162. If the bounce back voltage is equal to or less than 12.6 volts, the charger 100 is activated 402 to charge the battery for a set time 404.

While the battery is being charged 402, the current is monitored. If the charge is greater than five amps 406, the charger 100 continues to charge for the set time. If the current is less than or equal to five amps 406, the charger 100 continues to charge the battery for a minimum of at least five minutes 408.

Once the set time or five minutes of charging 408 is reached, the charger 100 turns off 410. A heavy load test is applied to the battery for at least ten seconds followed by the heavy load 144 being removed for at least twenty seconds 410. The previous application and removal of the heavy load 144 is important to condition the battery by stabilizing the battery voltage. Another heavy load test 412 is then performed on the battery.

The charger 100 then determines from the heavy load test 412 if the battery is good 414. If the battery is determined to be faulty or bad 416, the testing is terminated and the battery is discarded. If the battery is determined to be functional 414, or if the bounce back voltage is greater than 12.6 volts, the cold cranking amps ("CCA") are measured using a micro-load test 418.

In the preferred embodiment, the micro-load test 418 is performed after the battery is determined to be functional by the heavy load test 412. This micro-load test 418 is performed by applying a smaller load (approximately twenty to sixty amps) for a preset duration (approximately 250 milliseconds to one second) and measuring the CCA 420 after the micro-load 162 is removed. If the measured CCA is greater than 70% of the rated CCA 420 of the battery, then the battery is good and the charge is completed 424, then the cycle ends at 426. If the measured CCA is less than 70% of the rated CCA 420 of the battery, then it is bad battery 422 and will be discarded. It should be recognized that other micro-load tests could be substituted for the micro-load test 418 described above. For example, a dual micro-load test can also be used.

Figure 5:
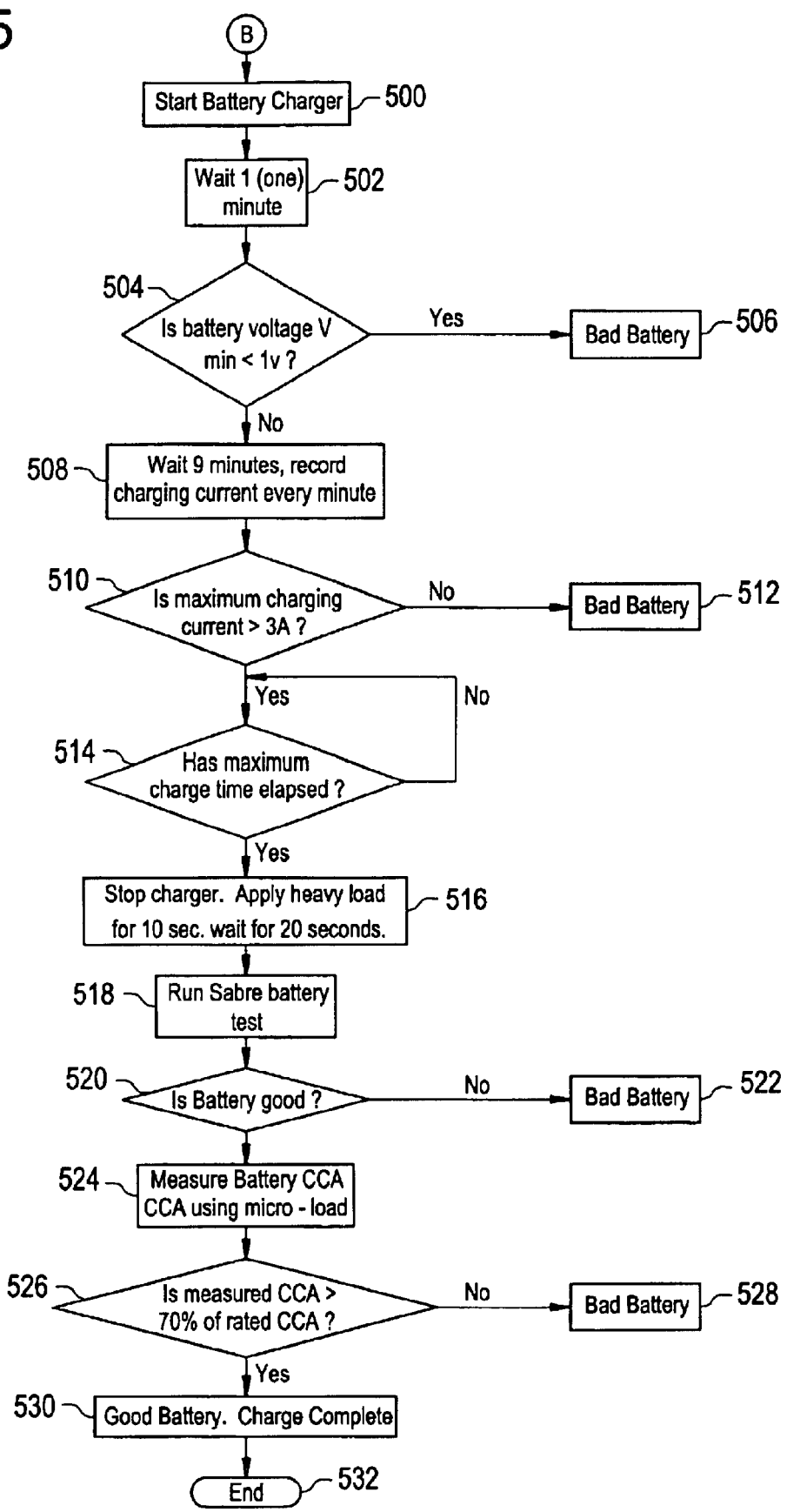
FIG. 5 is a flowchart of the process for testing and charging discharged batteries in accordance with a preferred embodiment of the present invention.

If the condition of the battery can not be determined from the heavy load test 412, the charger 100 will charge the battery and retest it in accordance with the method depicted in FIG. 5. For re-testing, the charger 100 is activated 500. The charger 100 charges the battery for approximately one-minute 502. The battery voltage is read after one-minute 504. If the battery voltage 504 is less than one volt after one minute, the battery is bad. The charger 100 is then turned off and the battery will be discarded 506.

If the voltage 504 is equal to or exceeds one volt after one minute of charging, the charger 100 will continue to charge for approximately nine minutes 508. During the nine minutes of charging, the charging current is recorded or read at one-minute intervals to determine if the charging current exceeds three amps 510. If the charging current is equal to or does not exceed three amps, the battery is determined to be bad 512 and the charger 100 is turned off and the battery is discarded.

If the charger's 100 current does exceed three amps, the charger will continue to charge for the set period of time as calculated above 514. The charger 100 will apply the heavy load 144 to the battery for a period of ten seconds to condition the battery and then removed the heavy load for a period of twenty seconds 516 for the battery voltage to stabilize. The heavy load test (e.g., Sabre Battery Test) is then performed 518.

The charger 100 then determines whether the battery is good 520. If the battery is determined to be bad 522, it is discarded. If the battery is determined to be functional 520, the CCA is then measured using the micro-load test 524. The measured CCA is then compared to the rated CCA for the battery 526. In the preferred embodiment of the invention, if the measured CCA is less than or equal to approximately seventy percent of the rated CCA for the battery 526, then the battery is determined to be bad 528 and is discarded. If the measured CCA 526 is greater than approximately seventy percent of the CCA, then the battery is determined to be good 530 and the charge is completed 532.

Referring to FIG. 1, the preferred embodiment contains an infrared temperature sensor 164, which aids in monitoring both the charger 100 and the battery being charged. The infrared temperature sensor 164 ensures that both the battery and charger 100 are maintained are safe levels. In the preferred embodiment, the infrared sensor 164 is contained within a housing. The housing is placed over the charging battery for safety reasons especially in the instance that, while charging, the battery unexpectedly explodes. The housing aids in containing the surrounding areas from the contaminants of the exploded battery.

The infrared temperature sensor 164 is placed within the housing to monitor the temperature of a charging battery. While charging a battery, heat is discharged or dissipated from the battery. However, excessive heat is an indication that the battery is being charged at an excessive rate. In the preferred embodiment, the infrared temperature sensor 164 is linked to the ADC 136, essentially an input to the ADC 136, which relays the information to the CPLD 140, which then relays it to the FPGA 142. The FPGA 142, with the help of the infrared temperature sensor 164, can monitor the temperature of the battery and relay the information, including any problems to the operator. The infrared temperature sensor 164 is aimed at the battery to ensure that the temperature of the battery is being monitored throughout the charging process. For example, if the battery being charged contains a short, the battery will heat excessively in a short period of time. The feedback from the infrared temperature sensor 164 can be used to alert the operator of the problem so that the operator can take the appropriate action.

A gel battery can heat excessively during charging and therefore, the charging current is applied in relation to the heat detected. For this type of battery, a temperature is fixed after which point the charging current is reduced. By monitoring the temperature and adjusting the current in view thereof, the charging time is reduced. The temperature and charging current are proportionally related in specific types of batteries (e.g. gel). Thus, by monitoring the temperature and the charging current, the gel battery or other batteries can be charged efficiently, and explosions can be prevented during charging.

In another embodiment, the infrared temperature sensor 164 can be aimed at the charger 100 only or in combination with the battery. By monitoring the charger 100, any excessive temperature generated by the charger can be relayed to the operator, thus appropriate actions can be taken to avoid overheating and damaging the charger.

One of ordinary skill in the art recognizes that the temperature sensor 164 can be located in a number of different locations, either located in the charger 100 or linked to the charger 100. The location of the infrared temperature sensor 164 is not limited to a housing. Additionally, temperature sensors are needed most when the battery is charging. Therefore, monitoring the temperature of the battery and/or the charger can help to prevent battery explosions.

In a preferred embodiment, a conventional processor is replaced by a dynamic FPGA 142. The use of the FPGA 142 allows a designer to make changes to the charger 100 without having to replace the processor. Changes to a mounted conventional processor requires remounting and reconfiguration of the charger 100 design, which in turn requires more design hours. With the use of the FPGA 142, the designer is allowed to make changes and additional costs on the fly without remounting or tireless reconfiguration of the initial design.

The FPGA 142 is configured and arranged to operate as a conventional processor. In the preferred embodiment the FPGA 142 control and processes a number of different functions of the charger 100. One such function is the operation of the micro and heavy load tests 418, 412. These tests are downloaded and stored into a memory device 144. It can also be stored in a RAM device 146. Once stored in these memory devices 144, 146, the code is downloaded into the FPGA 142 and executed. Upon execution of the code, the FPGA 142 begins to operate various controls of the charger 100, such as the solenoid switch 146 on the heavy load 144, and the SCR 126 for current and voltage control. Additionally, data can be inputted into the FPGA 142 through the input device 148, such as a keypad. The FPGA 142 can transmit to and receive information from an output display 150, a serial port 154, such as a printer port, a second serial port 152, such as an infrared bar code reader, a module port 156 that can accept various communication modules, or any other device that can communicate with the FPGA.

Upon start-up or boot-up of the charger 100, an image of a soft-core microprocessor is loaded from the memory (i.e. flash 144, RAM 146, etc.) into the FPGA 142. Therefore, there is an image of the FPGA 142 resides in the memory. Additionally, upon start-up, the CPLD 140 takes control of the data and address bus and clocks the FPGA 142 image from memory into the FPGA 142. As stated previously, this allows for redesign of the processor and the board without the need for remounting a processor. All that is necessary for a design change is to upload a new FPGA image into the memory device. Additionally, any new tests or operating parameters that is required by the operator can be easily upload into the FPGA 142 and executed. The preferred embodiment uses flash memory 144 to accomplish this function.

The output display 150 can be an integrated display or a remote display that relays information, such as data gathered from the charging and testing of the battery, and menu information. Additionally, the display 150 can notify the operator of any problems that have been detected. The serial port 154 in the preferred embodiment are standard RS-232 serial ports for connecting a device such as a printer. One of ordinary skill in the art will recognize that the RS-232 can be replaced with an RS-432, an infrared serial port or a wireless radio frequency port, such as BLUETOOTH™, or any other similar device.

In some embodiments of the current invention, a bar code port 152 is provided. The bar code port 152 may serve to operably connect a bar code reader (not shown) to the FPGA 142 or a microprocessor. In some embodiments, the bar code port 152 may be a conventional component, such as an RS-232. The bar code reader may be, for example, a conventional optical bar code reader, such as a gun or a wand type reader.

The operator swipes or aims the bar code reader on a bar code that is associated with the particular battery to be charged or tested and reads the bar code. The bar code itself may be affixed to the battery at the time of manufacture, purchase, or service. The bar code may contain information, or point to information stored in a database. The database may be located within the FPGA 142, the storage media 168 (below) or located remotely and accessed electronically. Examples of remotely located databases include data based accessible by the Internet, Ethernet, or other remote memory storage facility.

The bar code may provide a variety of information regarding the battery. For example, the bar code may provide information regarding the battery type (e.g. gel, flooded lead acid, deep cycle), the battery rating (cold cranking amps), maintenance information, serial number, lot number, warranty information, and a manufacture date code. This data can be used to select parameters for the test or charge cycle. The data provided by the bar code is not limited to the examples given.

In some embodiments, the printer port 154 may print bar code labels that may be attached or otherwise associated with the battery and provide updated information. The updated information may include, among other things, service dates, service procedures, and warranty information (e.g. time left on warranty, who was the original purchaser, what types of service are and are not warranted, etc.) The printed label may then be read by the bar code reader in subsequent tests or charge cycles.

Figure 6:
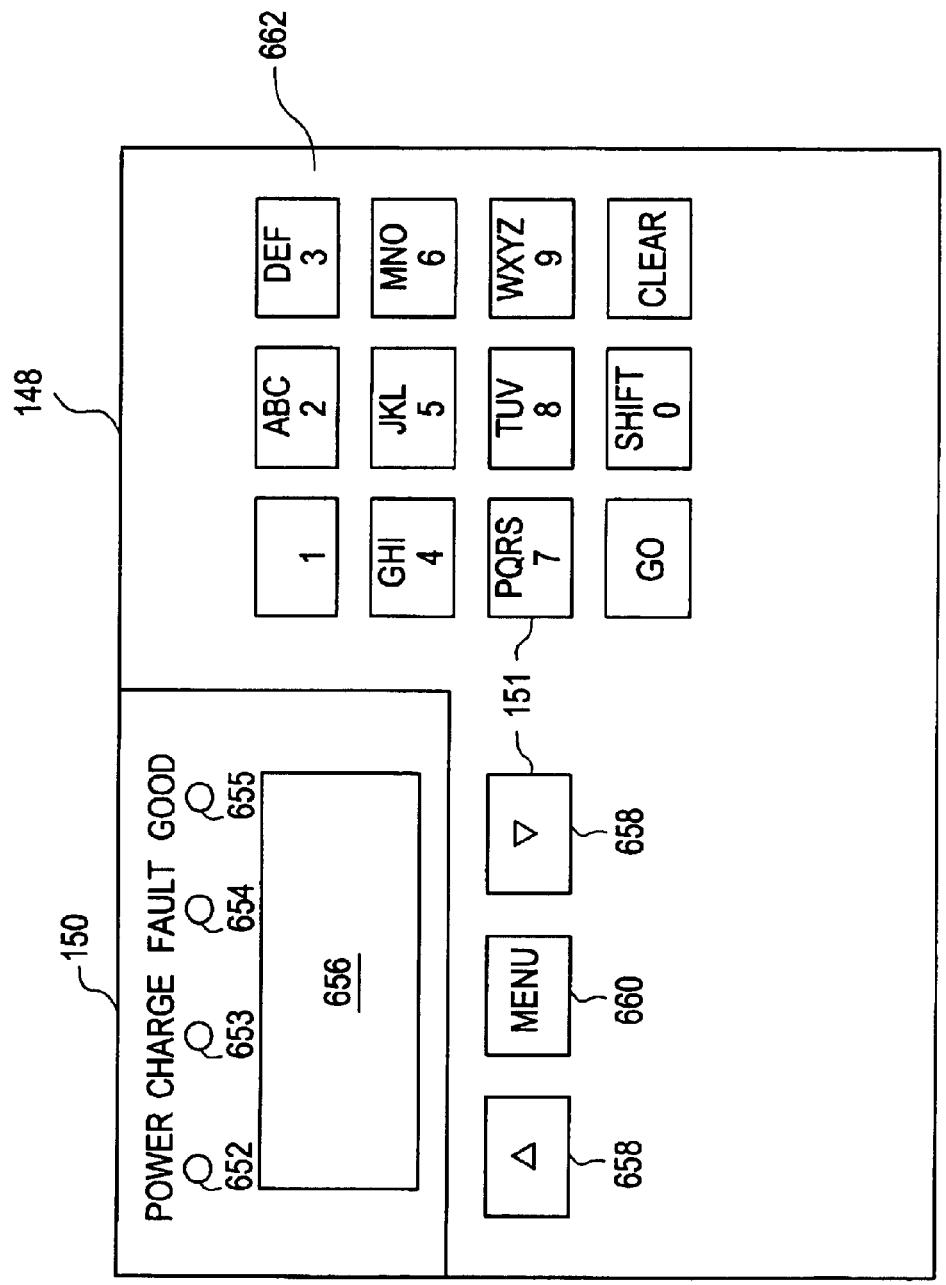
FIG. 6 is a front view of a display and keyboard of one embodiment of the current invention.

The output display 150 and an input device 148 are illustrated in a preferred embodiment in FIG. 6. The display 150 and input device 148 can be located preferably on a common face of a cabinet of the charger 100, although they alternatively can be located remote from each other and/or remote from the cabinet of the charger, if desired. The display 150 can include one or more LED's indicating states of the charger 100 or the battery during charging or testing. For example, LED 652 indicates that power is applied to the unit, LED 653 indicates a charge is being applied to the battery, LED 654 indicates a fault in the battery, and LED 655 indicates a good battery is detected. A segmented or dot matrix type, alphanumeric LCD display 656 may also be provided as part of the output display 150. For example, as shown in FIG. 6, the display 656 can be a 4 by 20 backlit LCD display, having four rows each having twenty character columns. This permits display of a wide range of information relating to e.g., charging status, time, amount, etc, as well as display and selection from a menu of control functions. Thus, the display 150 can include either the alphanumeric display 656, the LED's 652 to 655 or both. The two types of displays can be on a single panel or separate ones.

Control functions may be inputted via at least one, preferably two and more preferably three or more functional buttons, such as up down buttons 658, and a menu select button 660. A ten key alphanumeric keypad 662 may also or alternatively be provided for input of numeric data, alphabetic data, and/or command selection. Each key can provide for entry of a number, one or more letters, and/or a function. Thus, the input device 151 can include the menu button 660, the up down buttons 658, the alphanumeric keypad 662, or a combination thereof. These arrangements can be on a single panel or separate ones.

For example, the key labeled GO may generally be used in the affirmative. It usually means continue on. It is also used to initiate menu prompts leading to the test/charge sequence. The key labeled CLEAR can generally be used in the negative. It is generally used to clear a value that is to be entered. It may also be used to break out of a process or back out of a menu sequence. The key labeled MENU can be used to initiate the function menu. It is also used to back out of a menu sequence. The ARROW KEYS can be used to navigate within the menus and display screens. If an arrow is displayed on the right of the display, the corresponding arrow key can be used to "move" the view to another part of the menu or screen. The arrow keys may also be used to increment or decrement a displayed value. The NUMBER KEYS can be used to communicate with the application in a number of ways. They can be used to indicate the selection on a menu. They can also be used to provide numerical and/or alphabetical input to an application parameter.

The screen may include the ability to scroll through a set of menu items, such as for example, the following:

a) Top level menu, (GO or MENU)
b) Function Menu:
  1-Test Results
    1-View results
      1-Print results
      2-Print engineering data
    2-Print results
  2-Setup
    1-Set Clock
    2-Set Language
    3-Set Printer Port
    4-Ethernet Setup
    5-Save setup
  3-Self Test
    1-LCD Test
    2-keypad Test
    3-LED Test
    4-Audio Test
    5-Watchdog Test
    6-Load Cycle Test
    7-RAM test
    8-Checksum application
    9-Test Barcode Reader
  4-Update S/W
  5-Utility menu
    1-print codes
    2-upload data
  6-Calibrate
    1-Set DAC0
    2-Set DAC1
    3-Set Amps Offset
    4-Set Amps Gain
    5-Set Volts Offset
    6-Set Volts Gain
    7-TemperatureOffset
    8-Manual Controls
      1-Test SCR
      2-Enable SCR load
      3-Enable Low Volts Charging
      4-Auto Charge Mode
      5-Heavy Load Test
      6-Micro Load test
      7-Manual Charge Mode
      8-Monitor Volts
    9-Save Calibrations This menu is by way of example only. Other features, commands, displays or inputs, for example may also be provided.

Referring to FIG. 1 an additional smaller transformer 158 provides current and voltage to the I/O control 134 and a cooling fan 160. The smaller transformer 158 provides a step down of both the voltage and current to a level that enables the I/O control 134 and a cooling fan 160 to operate. The cooling fan 160 helps to control the operating temperature of the charger 100.

The peripheral module port 156 can be constructed and arranged to receive an information relay device, such as an Ethernet wired module 166 and/or an Ethernet wireless module 164. The Ethernet modules 164, 166 communicate at data rates of 10 Mbps (10Base-T Ethernet), 100 Mbps (Fast Ethernet), 1000 Mbps (Gigabit Ethernet), and other data rates. The Ethernet modules 164, 166 can relay information between the charger 100 and another device connected to the modules via a wire or wirelessly. The information relayed can include data from the result of the charging/testing of the battery, data of the battery's warranty information, data of the battery type (deep cycle, gel, etc.), data of battery make and model, data from previous charging/testing of the battery, firmware update, data from diagnostic or operating parameters of the charger 100, maintenance data of the charger 100, and any other data required by the operator.

The peripheral module port 156 is in communication with the FPGA 142. Information can be exchanged between the peripheral module port 156, the Ethernet modules 164, 166, and the FPGA 142. The Ethernet modules 164, 166 can relay the information to and from a remote device, such as a network server, a printer, a personal computer, a workstation, a file server, a print server, other communication devices, such as a fax machine, a cellular/digital phone, a pager, a personal digital assistant, an email receiver, and a display. Through the use of the Ethernet modules 164, 166 any information, such as the information of the battery tested by the charger 100 can be relayed to a printer server and printed. Thus, the charger 100 is not dependent on a stand-alone printer that may be down, and can print to any networked printer, thereby saving time and money to the operator.

With the Ethernet module 164, 166, information can also be stored remotely, such as on a workstation, a file server or other data storage device. For example, after the charger 100 concludes the charging/testing of the battery, the information from the test/charge can be relayed and stored on a networked personal computer. With the information stored on the networked personal computer, the information from any previous charge/test can be compared with the latest information, a report can be generated and forwarded to the appropriate personnel.

If the chargers 100 (same or similar model) that are used by the operator are "networked" together, the chargers' firmware can be updated simultaneously. Conventionally, to update firmware, a laptop is hooked up to the charger 100 and the new firmware is uploaded. Once the upload is completed, the operator then must go to the next charger 100 and repeat the process until all of the chargers 100 are updated with the new firmware. By being able to upload new firmware onto networked chargers 100, the update process will be less time consuming, and thus cost-effective for the operator. By having the chargers 100 networked via the Ethernet modules 164, 166, information from all the chargers 100 can be relayed and displayed to the operator. Because the chargers 100 can be networked, the operator does not have check each individual charger 100 to see if the charging and testing is completed and save valuable time and money. Additionally, by being networked, the chargers 100 can be instructed to run diagnostics and other functions remotely without having to individually program each charger 100.

In another embodiment, a notification system is provided to notify the operator when there is a problem with the charger 100 or the battery or when the charging/testing is completed. Typically, the operator has to physically check the status of the charger 100 and often would have to return many times to see if the charging/testing is completed. With the charger 100 having an Ethernet connection modules 164, 166, the status information can be relayed to a remote location, such as the network server or the personal computer, which can be programmed to notify the operator of any problems or the completion of the charging/testing. Because the operator can be notified of any problems, the operator can take appropriate measures, such as terminating the charging of the battery because charger 100 or the battery is overheating. By being notified of any problems, the operator can save money due to a decrease in electricity usage and decrease the possibility of an explosion due to overcharging the battery. Notification of the operator can be done with a personal computer that can notify the operator via another display, by pager, by fax, by email, by phone, by computer or by any means that will relay the requested information to the operator.

In another embodiment of the invention, the peripheral module port 156 can be constructed and arranged to accept a removable data storage media 168 ("storage media"). Information can be exchanged between the peripheral module port 156, the storage media 168, and the FPGA 142. The storage media 168 can be permanently fixed to the charger 100 to provide additional memory or can be removable, as required by the operator. The storage media 168 can transfer information to and from the charger 100. The information can include data from the result of the charging/testing of the battery, the battery's warranty information, the battery type (deep cycle, gel, etc.), battery make and model, data from previous charging/testing of the battery, firmware update, data from diagnostic or operating parameters of the charger 100, maintenance data of the charger 100, and any other data required by the operator.

The storage media 168 can include, but not limited to floppy disc (including ZIP); tape drive cartridge (such as DAT); optical media (such as CD-ROM, DVD-ROM, etc.); flash memory (such as smart media, compact flash, PC card memory, memory sticks, flash SIMMs and DIMMS, etc.); magnetic based media, magneto optical; USB drives; or any other storage media that an operator can store or retrieve information from it. A person skilled in the art will recognize that any storage media can be used.

One use of the storage media 168 is to update firmware, wherein the storage media can be programmed with the firmware update and loaded into the charger 100. By using the user interface 148, the operator can select the "update firmware" option from a menu that was previously provided to the charger 100. The charger 100 is able to retrieve the new firmware and update the charger 100. In another example, the operator can use the storage media 168 to store information regarding the battery that was charged/tested. The information can be downloaded into the storage media 168, such as a compact flash card, and can be sent to the appropriate person. Additionally, the storage media 168 can contain information from the charging/testing result of a battery at another location and can be uploaded into the charger 100 and displayed to the operator. Alternatively, the information can be relayed via the Ethernet module to be viewed, stored, or printed at a remote location. The storage media 168 can also provide an image of a soft-core microprocessor to the FPGA 142 during start-up. By having the storage media 168, the files relating to information, the results from previous tests charges, can be easily matched up to the battery and electronic files are stored in less space than their equivalent amount in paper files.

The charger 100 can have more than one peripheral module port 156 so that a communication nodule, a storage media module, and an many other modules as needed can be onboard the charger. The peripheral module port 156 provides flexibility to the charger 100 and provides a port so that any new device can be added to the charger as needed by the operator.

The many features and advantages of the invention are apparent from the detailed specification, and thus, it is intended by the appended claims to cover all such features and advantages of the invention which fall within the true spirits and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

What is claimed is:

1. A charging apparatus, comprising:
   a power source charger and tester having a module port; and
   a removable data module received in the module port and is in communication with the power source charger and tester.

2. The charging apparatus of claim 1, wherein the power source charger and tester further comprises a controller that is in communication with the removable data module.

3. The charging apparatus of claim 2, wherein the controller can store data on the removable data module.

4. The charging apparatus of claim 2, wherein the controller can retrieve data contained in the removable data module.

5. The charging apparatus of claim 1, wherein the removable data module can be selected from a group consisting of a floppy disc, a tape drive cartridge, an optical media, a flash memory, a magnetic based media, a magneto optical, a hard drive, any other removable media and a combination thereof.

6. The charging apparatus of claim 1 wherein the removable data module's data can be selected from a group consisting of the result of the charging/testing of the battery, the battery's warranty information, the battery type, the battery brand, the battery model, previous information regarding charging/testing of the battery, firmware update, diagnostic or operating parameters information of the charger, maintenance information of the charger, any other data required by the operator, and a combination thereof.

7. A method of storing and retrieving data for a charging and testing apparatus, comprising:
   operating the charging apparatus and tester; and
   accessing a removable data module by a microprocessor.

8. The method of claim 7, wherein operating the charging apparatus and tester is charging the battery.

9. The method of claim 7, wherein operating the charging apparatus and tester is testing the battery.

10. The method of claim 7, wherein accessing the removable data module is storing data resulting from operating the battery charger and tester.

11. The method of claim 7, wherein accessing the removable data module is retrieving previously stored data.

12. The method of claim 7, wherein the removable data module can be selected from a group consisting of a floppy disc, a tape drive cartridge, an optical media, a flash memory, a magnetic based media, a magneto optical, a hard drive, any other removable media, and a combination thereof.

13. A charging system, comprising:
   a power source charger and testing means having a module receiving means; and
   a removable data means is received in the module receiving means and is in communication with the power source charger means.

14. The charging system of claim 13, wherein the power source charger and testing means further comprises a controller means that is in communication with the removable data means.

15. The charging system of claim 14, wherein the controller means can control and store data onto the removable data means.

16. The charging system of claim 14, wherein the controller means can control and retrieve data from the removable data means.

17. The charging system of claim 13, wherein the removable data means can be selected from a group consisting of a floppy disc, a tape drive cartridge, an optical media, a flash memory, a magnetic based media, a magneto optical, a hard drive, any other removable media, and a combination thereof.

* * * * *